United States Patent [19]

Yamaguchi et al.

[11] 4,215,316
[45] Jul. 29, 1980

[54] AM STEREO SIGNAL DEMODULATION CIRCUIT

[75] Inventors: Tadahiro Yamaguchi; Koki Aizawa, both of Tokorozawa, Japan

[73] Assignee: Pioneer Electronic Corporation, Tokyo, Japan

[21] Appl. No.: 948,834

[22] Filed: Oct. 5, 1978

[30] Foreign Application Priority Data

Oct. 12, 1977 [JP] Japan .................................. 52-122179

[51] Int. Cl.$^2$ ............................................. H03D 1/02
[52] U.S. Cl. ................................. 329/50; 179/1 GS; 329/101; 329/166; 329/167; 329/192
[58] Field of Search ............. 179/1 GD, 1 GE, 1 GS; 329/101, 166, 167, 192, 50; 325/36

[56] References Cited
U.S. PATENT DOCUMENTS

| | | | |
|---|---|---|---|
| 3,721,766 | 3/1973 | Hilbert | 179/1 GE |
| 4,054,839 | 10/1977 | Ohsawa | 179/1 GE X |
| 4,074,075 | 2/1978 | Ohsawa | 329/167 X |

*Primary Examiner*—Siegfried H. Grimm
*Assistant Examiner*—Edward P. Westin
*Attorney, Agent, or Firm*—Sughrue, Rothwell, Mion, Zinn & Macpeak

[57] ABSTRACT

A stereo signal demodulation for obtaining left and right channel signals from an input stereo signal. A differential amplifier is coupled to a constant current source and first and second multipliers are coupled to the differential amplifier. A dividing circuit is coupled to the amplifier and the resulting channel signals are obtained in full wave rectified form.

15 Claims, 3 Drawing Figures

AM STEREO SIGNAL DEMODULATION CIRCUIT

BACKGROUND OF THE INVENTION

The present invention relates to a stereo signal demodulation circuit and, particularly, to a demodulation circuit for the compatible quadrature AM stereo signal which is compatible with both stereo and monaural receivers.

The AM stereo signal of the compatible quadrature AM system is one of a stereo signal system, which is expressed as follows:

$$\text{stereo signal} - e_s = [\{1 + k(L_{(t)} + R_{(t)})\} \cos \omega_c t + k\{L_{(t)} - R_{(t)}\} \cos (\omega_c t + \pi/2)] \cos \phi \quad (1)$$

$$\phi = \tan^{-1} k\{L_{(t)} - R_{(t)}\}/[1 + k\{L_{(t)} + R_{(t)}\}] \quad (2)$$

where: $L_{(t)}$ and $R_{(t)}$ are the left channel signal and the right channel signal, respectively;
$\omega_c$ is an angular frequency of a carrier signal, and
$k$ is a modulation factor.

The compatible quadrature AM stereo signal expressed by equations (1) and (2) contains a first signal component obtained by amplitude modulating the carrier signal $\cos \omega_c t$ with a signal corresponding to the sum of the left and right channel signals. A second signal component is obtained by amplitude modulating the signal $\cos (\omega_c t + \pi/2)$, which is out of phase by 90° from the carrier signal, with a signal corresponding to the difference between the left and right channel signals. The level of the composite signal of the first and second signal components is modulated with $\cos\phi$, as indicated in the equation (1), to make possible demodulation of the composite signal in a monaural receiver.

A demodulation circuit for the stereo signal represented by equations (1) and (2), is conventionally a product-demodulation circuit, known in the art, which utilizes a differential amplifier. The conventional product-demodulation circuit tends, however, to produce distortion in the final audio signal because the left and right channel signals $L_{(t)}$ and $R_{(t)}$ are obtained as half-wave rectified signals.

SUMMARY OF THE INVENTION

An object of the present invention is to provide stereo signal demodulation by which the left and right channel signals can be obtained in full wave rectified form.

Another object of this invention is to provide demodulated signals eliminating the distortion in final audio signals.

Still another object of this invention is to provide a demodulation circuit having full wave rectified output signals and that is formed from simple components and readily made as in the form of an integrated circuit.

A stereo signal demodulation circuit of this invention comprises a number of differential circuits. First and second differential circuits each have two transistors having their emitters connected commonly, and the signal to be demodulated is applied between the bases of the transistors. A third differential circuit with two transistors having their emitters connected to a collector of the first transistor of the first circuit. A fourth differential circuit also has transistor emitters connected to a collector of the second transistor of the first circuit. Fifth and sixth differential circuits have transistors with their emitters connected to collectors transistors in the second circuit. In operation a first signal having frequency and phase corresponding to those of a first carrier signal of the signal to be demodulated is applied between bases of the transistors in the third circuit and between bases of transistors in the fourth circuit. A second signal having frequency and phase corresponding to those of a second carrier signal and out of phase by 90° from the first carrier signal is applied between said bases of the transistors in the fifth and sixth circuits. A first output signal containing a first channel signal is obtained between a collector connection of transistors of third and fourth circuits. A second output signal containing a second channel signal is derived across a collector connection of the transistors in the fifth and sixth circuits.

DETAILED DESCRIPTION OF THE PREFERRED EMBODIMENT

The equation (1) mentioned previously can be transformed as follows:

$$e_s = [\{1 + kL_{(t)}\} \cos (\omega_c t + \pi/4) + \{1 + kR_{(t)}\} \cos (\omega_c t - \pi/4)] \cdot \cos \phi / \sqrt{2} \quad (3)$$

As will become clear from equation (3), the stereo signal $e_s$ is obtained by modulating the amplitudes of first and second carrier waves out of phase by 90° from each other with the left and right channel signals $L_{(t)}$ and $R_{(t)}$, respectively, adding the amplitude modulated carrier waves and multiplying the resulting signal by $\cos \phi$.

Figure 1:
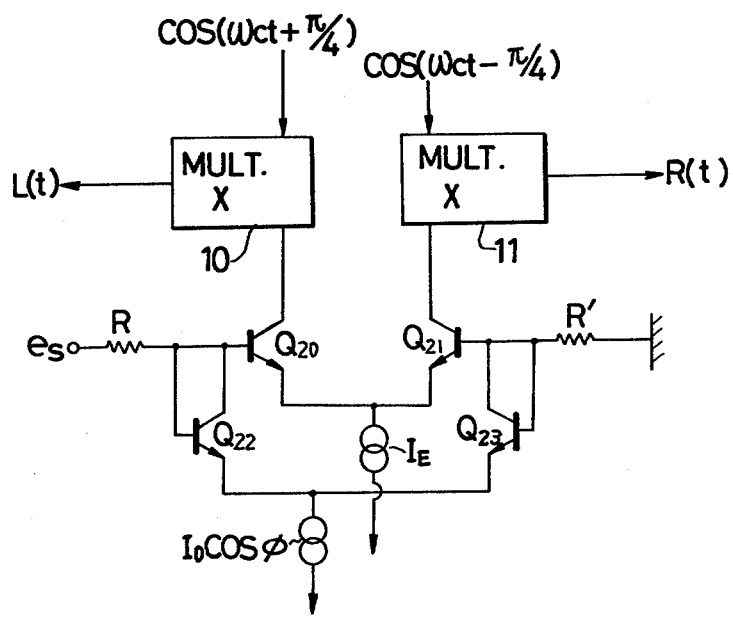
FIG. 1 is a circuit diagram of a demodulation circuit for a compatible quadrature AM stereo signal for explaining the principle thereof.

In FIG. 1, a product demodulation circuit comprises a differential amplifier circuit including a pair of transistors $Q_{20}$ and $Q_{21}$ having emitters commonly connected to a constant current source $I_E$. Multipliers 10 and 11 each comprising a differential circuit are connected to the collectors of the transistors $Q_{20}$ and $Q_{21}$, respectively. When a first signal $\cos (\omega_c t + \pi/4)$ and a second signal $\cos (\omega_c t - \pi/4)$ are supplied across base electrodes of transistors constituting the multipliers 10 and 11, respectively, products of the input signal $e_s$ and the first signal and the input signal $e_s$ and the second signal are obtained by the multipliers 10 and 11, respectively. These product outputs are the signals $L_{(t)}$ and $R_{(t)}$, respectively.

In order to exclude $\cos \phi$, these product outputs are supplied to a dividing circuit functioning to divide an input signal by $\cos \phi$. The dividing circuit comprises transistors $Q_{22}$ and $Q_{23}$. A collector and a base of transistor $Q_{22}$ are commonly connected to the base of the transistor $Q_{20}$ to form an anode of a diode. An emitter of the transistor $Q_{22}$, i.e., a cathode of the diode is connected to a current source which provides a current $I_o \cos \phi$. In a similar manner, a collector and base of the transistor $Q_{23}$ are also commonly connected to the base of the transistor $Q_{21}$ and an emitter of $Q_{23}$ is connected to the current source $I_o \cos \phi$.

Assuming that the input impedance of the respective differential amplifiers $Q_{20}$, and $Q_{21}$ is very large in comparison with the operating resistances of the diodes formed by $Q_{22}$ and $Q_{23}$, respectively, the following equation may be established.

$$V_{BE20} + V_{BE22} = V_{BE21} + V_{BE23} \tag{4}$$

where $V_{BE}$'s are base-emitter voltages of the respective transistors.

The base-emitter voltage of each of the transistors can be expressed as follows:

$$V_{BE} = (kT/q) \cdot \ln(I_e/I_s) \tag{5}$$

where:
k is Boltzmann's constant,
q is an electron density,
T is the absolute temperature,
$I_s$ is a reverse saturation current, and
$I_e$ is an emitter current.

From equations (4) and (5), the following equation is derived:

$$\frac{kT}{q} \cdot \ln\left[\frac{I_{e20}}{I_{s20}} \cdot \frac{I_{e22}}{I_{s22}} \cdot \frac{I_{s21}}{I_{e21}} \cdot \frac{I_{s23}}{I_{e23}}\right] = 0 \tag{6}$$

The equation is rewritten as follows:

$$I_{e20}/I_{e21} = I_{e23}/I_{e22} \tag{7}$$

This is established because $I_s$ for each transistor is substantially common.

Equation (7) is further rewritten as follows:

$$I_{e21} = \frac{I_{e20} + I_{e21}}{I_{e22} + I_{e23}} \cdot I_{e22} = \frac{I_E}{I_o \cos\phi} \cdot I_{e22} \tag{8}$$

since $I_{e22} = (e_s/2) \cdot (1/R)$, equation (8) can be expressed as follows:

$$I_{e21} = (e_s/I_o \cos\phi) \cdot (I_E/2R) \tag{9}$$

As will be clear from equation (9), the collector current (2 times the emitter current $I_{e21}$) of the differential transistor $Q_{21}$ is proportional to a value obtained by dividing the input signal $e_s$ by the sum ($I_o \cos\phi$) of the currents flowing through the diodes $Q_{22}$ and $Q_{23}$.

Figure 2:
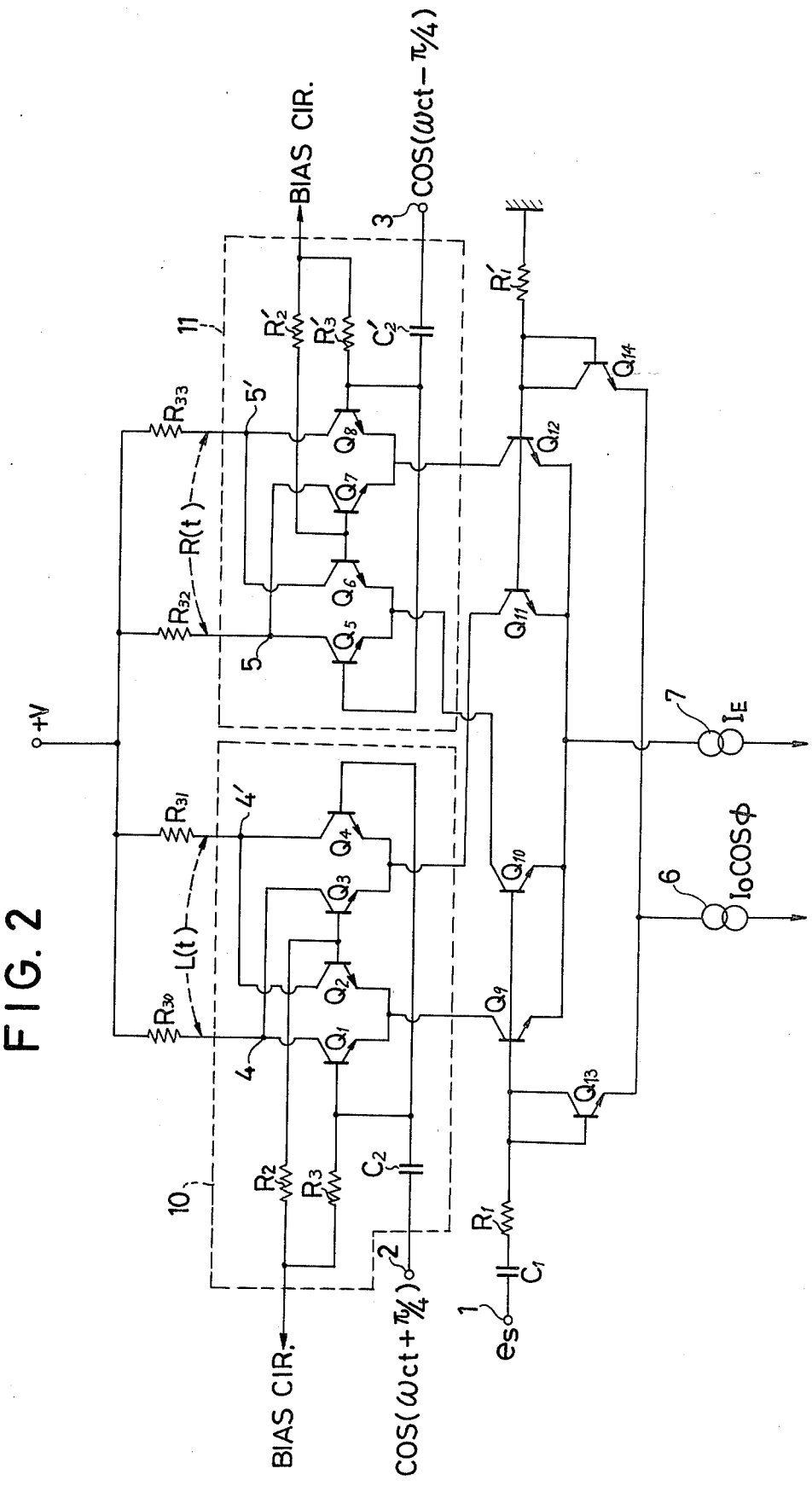
FIG. 2 is a circuit diagram of the preferred embodiment of the present ivention.

Referring now to FIG. 2 an example of a circuit embodying the circuit shown in partial block in FIG. 1 is shown. In FIG. 2, the first differential circuit comprises transistors $Q_9$ and $Q_{11}$ having their emitters commonly connected. The second differential circuit similarly comprises transistors $Q_{10}$ and $Q_{12}$. The bases of transistors $Q_9$ and $Q_{10}$ are commonly connected and as shown, the bases of transistors $Q_{11}$ and $Q_{12}$ are also commonly connected. The common emitter junctions of the first and second differential circuits are commonly connected to a constant current source 7($I_E$).

The signal $e_s$ to be demodulated, which is expressed by equation (3), is supplied across the common base connections of the transistors $Q_9$ and $Q_{12}$. That is, the common base connection of the transistors $Q_{11}$ and $Q_{12}$ is grounded through a resistor $R_1'$ and the common base connection of the transistors $Q_9$ and $Q_{10}$ is connected through a resistor $R_1$ and a D.C. blocking capacitor $C_1$ to an input terminal 1 to which the signal $e_s$ is supplied.

The first and second differential circuits include a dividing circuit comprising transistors $Q_{13}$ and $Q_{14}$ which correspond to the transistors $Q_{22}$ and $Q_{23}$ in FIG. 1, respectively.

A third differential circuit is formed comprising transistors $Q_1$ and $Q_2$ having commonly connected emitters to a collector of the transistor $Q_9$. Similarly, a fourth differential circuit is utilized having transistors $Q_3$ and $Q_4$ with their emitters commonly connected to a collector of the transistor $Q_{11}$. A signal $\cos(\omega_c t + \pi/4)$ is supplied across the base of the transistors $Q_1$ and $Q_2$ and across the bases of the transistors $Q_3$ and $Q_4$. The bases of transistors $Q_1$ and $Q_4$ and the bases of transistors $Q_2$ and $Q_3$ are commonly connected, respectively. The common base connection of transistors $Q_2$ and $Q_3$ is connected through a resistor $R_2$ to a biasing circuit (not shown) and the common base connection of transistors $Q_1$ and $Q_4$ is connected through a resistor $R_3$ to the biasing circuit. The common connection of $Q_1$ and $Q_4$ is further connected through a capacitor $C_2$ to a terminal 2 to which the signal $\cos(\omega_c t + \pi/4)$ is supplied. The collectors of transistors $Q_1$ and $Q_3$ are connected commonly and the collectors of the transistors $Q_2$ and $Q_4$ are also connected commonly.

Therefore, an output appearing across the common collector connections 4 and 4' contains a full wave rectified one channel signal, for example, left channel signal $L_{(t)}$.

Again referring to FIG. 2, a fifth differential circuit comprising transistors $Q_5$ and $Q_6$ and a sixth differential circuit comprising transistors $Q_7$ and $Q_8$ are connected to the collectors of the transistors $Q_{10}$ and $Q_{12}$ of the second differential circuit. The bases of transistors $Q_6$ and $Q_7$ are commonly connected and the common connection is connected through a resistor $R'_2$ to a biasing circuit. The bases of the transistors $Q_5$ and $Q_8$ are commonly connected and the common connection is connected through a resistor $R'_3$ to the biasing circuit and through a capacitor $C'_2$ to a terminal 3 to which a signal $\cos(\omega_c t - \pi/4)$ is supplied.

Similarly as in the case of the left channel signal, an output containing the full wave rectified right channel signal $R_{(t)}$ is obtained across common collectors of the transistors $Q_5$ and $Q_7$ and collectors of the transistor $Q_6$ and $Q_8$.

The operation of the demodulation circuit in FIG. 2 will now be described. The input signal $e_s$ is divided by $\cos\phi$ by means of the dividing circuit comprising the transistors $Q_{13}$ and $Q_{14}$ each acting as a PN junction diode and the current source 6 provides the current of $I_o \cos\phi$, as mentioned in conjunction with FIG. 1. Therefore, the divided signal $e_s$ in equation (3) can be expressed as follows, $$\frac{e_s}{\cos\phi/\sqrt{2}} = e_s' = \{1 + kL(t)\}\cos(\omega_c t + \pi/4) + \{1 + kR(t)\}\cos(\omega_c t - \pi/4) \tag{10}$$

With respect to the demodulation of the signal $L_{(t)}$, the third and fourth differential circuits ($Q_1$ to $Q_4$) are used as the product demodulation circuit having the input terminal 2 to which the signal $\cos(\omega_c t + \pi/4)$ is supplied.

Therefore, the output voltage $e_L$ obtained across the output terminals 4 and 4' is expressed as follows:

$$e_L = e_s' \cdot \cos(\omega_c t + \pi/4) \tag{11}$$

By combining the equations (10) and (11), the following equation is obtained:

$$e_L = \tfrac{1}{2}\cdot\{1+kL_{(t)}\} + \tfrac{1}{2}[-\{1+kL_{(t)}\}\sin 2\omega_c t + \{1+kR_{(t)}\}\cos 2\omega_c t] \quad (12)$$

The first term of the equation (12) includes a d.c. component and the signal $L_{(t)}$ component and the second term thereof includes a component having a frequency which is twice the carrier frequency. Therefore, the components included in the first and second terms can be easily removed by a low pass filter. Consequently, the full wave rectified demodulation of the signal $L_{(t)}$ is obtained.

The signal $R_{(t)}$ is processed by the fifth and sixth differential circuits ($Q_5$ to $Q_8$) with the signal $\cos(\omega_c t - \pi/4)$ supplied to the input terminal 3, resulting in a signal across the output terminals 5 and 5', from which the full wave rectified demodulation of the signal $R_{(t)}$ is obtained in the same manner as the full wave rectified signal $L_{(t)}$ is obtained.

Resistors $R_{30}$ to $R_{33}$ are load resistances for the third to sixth differential circuits, respectively.

Figure 3:
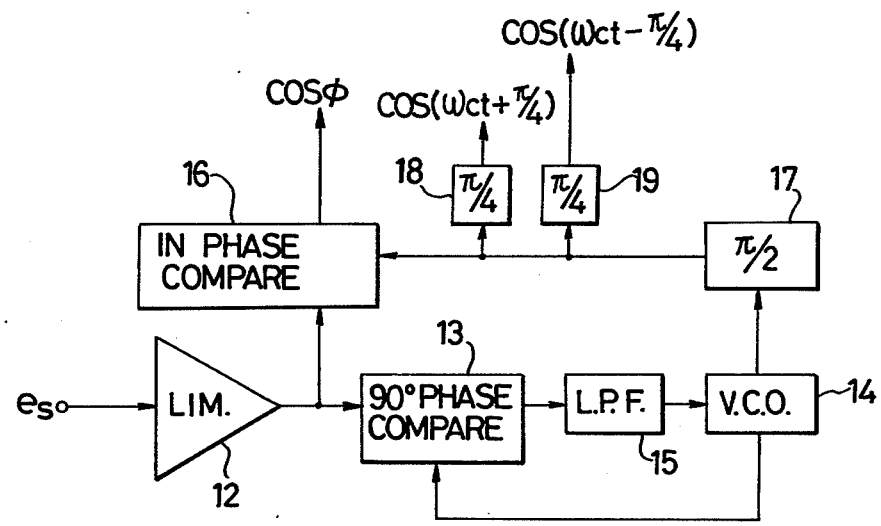
FIG. 3 is a block diagram of a circuit for producing a signal suitable to be used in the circuit in FIG. 2.

Referring now to FIG. 3 an example of the signal generator circuit for producing the signal components $\cos\phi$, $\cos(\omega_c t + \pi/4)$ and $\cos(\omega_c t - \pi/4)$ to be used in the circuit shown in FIG. 2 is shown.

In FIG. 3, the input signal $e_s$ to be demodulated is amplitude-limited by a limiter 12, resulting in a substantially rectangular signal. An output of the circuit is connected to an input of a 90° phase comparator 13, a so called "quadrature phase detector", in which the output signal of the generator is compared with the output frequency of a voltage controlled oscillator 14. The output voltage of the quadrature phase detector 13 is supplied through a low-pass filter 15 to the voltage controlled oscillator 14 as a control voltage. The output of the voltage controlled oscillator 14 which is out of phase by $\pi/2$ (90°) from the input $e_s$ is supplied to a in-phase comparator 16 after being phase shifted by $\pi/2$ by a phase shifter 17. In the in-phase comparator 16, the phase shifted output of the voltage is compared with the rectangular signal from the limiter 12, causing an output of the comparator 16 to be the signal $\cos\phi$. Furthermore, by connecting $\pi/4$ phase shifters 18 and 19 to the output of the $\pi/2$ phase shifter 17, the signal components $\cos(\omega_c t + \pi/4)$ and $\cos(\omega_c t - \pi/4)$ are obtained.

As described in detail, according to the present invention, the two channel signals $L_{(t)}$ and $R_{(t)}$ included in the compatible quadrature AM stereo signal can be obtained as full wave rectified signals. Therefore, distortion due to conventional modulation by which half wave rectified signals are available can be completely eliminated. Since the present invention requires only the addition of a low-pass filter having simple construction, the construction of a receiver to which the present invention is applied does not become overly complicated. Furthermore, the present invention is in the form of differential circuit construction and it can be easily produced in IC form, causing it to be compact and light weight.

It is apparent that modifications of the invention herein described are possible without departing from the essential scope thereof.

What is claimed is:

1. A stereo signal demodulation circuit comprising a first differential circuit including first and second transistors having emitters connected commonly; means for applying an input stereo signal to be demodulated between the bases of said first and second transistors; a second differential circuit including third and fourth transistors having their emitters commonly connected, said signal to be demodulated being applied between bases of said third and fourth transistors; a third differential circuit including fifth and sixth transistors having their respective emitters connected to the collector of said first transistor; a fourth differential circuit including seventh and eighth transistors having their respective emitters connected to the collector of said second transistor; a fifth differential circuit including ninth and tenth transistors having their respective emitters connected to the collector of said third transistor; and a sixth differential circuit including eleventh and twelfth transistors having their respective emitters connected to collector of said fourth transistor; wherein, when a first signal having frequency and phase corresponding to that of a first carrier signal of said stereo signal to be demodulated is applied between the bases of said fifth and sixth transistors and between the bases of said seventh and said eighth transistors, and when a second signal having frequency and phase corresponding to a second carrier signal out of phase by 90° from said first carrier signal is applied between the bases of said ninth and tenth transistors and between the bases of said eleventh and twelfth transistors, a first output signal containing a first channel signal is derived between a common collector connection of said fifth and eighth transistors and a common collector connection of said sixth and said seventh transistors, and a second output signal containing a second channel signal is derived between a common collector connection of said ninth and twelfth transistors and a common collector connection of said tenth and eleventh transistors.

2. A stereo signal demodulation circuit as defined in claim 1, wherein said stereo signal to be demodulated contains said first carrier signal amplitude-modulated by said first channel signal and said second carrier signal amplitude-modulated by said second channel signal, and wherein a sum signal of said first and said second amplitude-modulated carrier signals is varied in amplitude in response to a phase comparison signal generated from said first and said second channel signals.

3. A stereo signal demodulation circuit as defined in claim 2, wherein the bases of said first and third transistors are commonly connected to a first common base connection and the bases of said second and fourth transistors are commonly connected to a second common base connection, and said first and second common base connections are connected through PN junction elements to a current source whose current varies with said phase comparison signal.

4. A stereo signal demodulation circuit as defined in claim 1, 2 or 3, wherein said first to sixth differential circuits are formed in an integrated circuit.

5. A stereo signal demodulation circuit comprising:
a constant current source;
a differential amplifier circuit coupled to said source and having input terminal means for receiving an input stereo signal and having first and second output terminals;
means for applying to said input means a stereo signal having the form $$e_s = [\{1 + k(L_{(t)} + R_{(t)})\}\cos\omega_c t + k\{L_{(t)} - R_{(t)}\}\cos(\omega_c t + \pi/2)]\cos\phi,$$

where, $$\phi = \tan^{-1} k\{L_{(t)} - R_{(t)}\}/[1 + k\{L_{(t)} + R_{(t)}\}]$$

where
$L_{(t)}$ and $R_{(t)}$ are the left channel signal and right channel signal, respectively;
$\omega_c$ is the angular frequency of a carrier signal; and
$k$ is a modulation factor;
first and second multipliers respectively coupled to said first and second output terminals of said differential amplifier circuit for separately multiplying the stereo signal by signals having the forms cos $(\omega_c t + \pi/4)$ and cos $(\omega_c t - \pi/4)$, respectively; and
a dividing circuit coupled to said differential amplifier circuit for dividing said stereo signal by a signal having the form of cos $\phi$, wherein, when said stereo signal is applied to said differential amplifier circuit, first and second components of said stereo signal which represent the right and left channel audio signals, are obtained from said multipliers as full wave rectified signals.

6. The circuit of claim 5 wherein said differential amplifier comprises first and second transistors having their emitters coupled to said constant current source.

7. The circuit of claim 6 wherein the collector of said first transistor is coupled to said first multiplier and the collector of said second transistor is coupled to said second multiplier.

8. The circuit of claim 6 or 7 wherein said dividing circuit comprises third and fourth transistors wherein the collector and base of said third transistor are commonly connected to the base of said first transistor and the collector and base of said fourth transistor are commonly connected to the base of said second transistor, and the emitters of said third and fourth transistors are commonly connected to a variable current source which supplies a current varying according to cos $\phi$.

9. The circuit of claim 8 wherein the common connection of the base and collector of said third transistor forms the anode of a first diode and the common connection of the base and collector of said fourth transistor forms the anode of a second diode.

10. The circuits of claims 5, 6 or 7 wherein said demodulation circuit is formed as an IC module.

11. A stereo signal demodulation circuit for demodulating the stereo signal directly to produce full wave rectified right and left channel audio signals, said stereo signal having the form:

$$e_s = [\{1 + k(L_{(t)} + R_{(t)})\} \cos \omega_c t + k\{L_{(t)} - R_{(t)}\} \cos (\omega_c t + \pi/2)] \cos \phi,$$

where, $$\phi = \tan^{-1} k\{L_{(t)} - R_{(t)}\}/[1 + k\{L_{(t)} + R_{(t)}\}]$$

where
$L_{(t)}$ and $R_{(t)}$ are the left channel signal and right channel signal, respectively;
$\omega_c$ is the angular frequency of a carrier signal; and
$k$ is a modulation factor,
said demodulation circuit comprising:
divider means for dividing said stereo signal by a signal having the form of cos $\phi$; and
multiplier means for separately multiplying the divided stereo signal by signals of the form cos $(\omega_c t + \pi/4)$ and cos $(\omega_c t - \pi/4)$, respectively, thereby directly producing first and second components of said stero signal which contain the right and left channel audio signals as full wave rectified signals.

12. A method of demodulating a stereo signal having the form:

$$e_s = [\{1 + k(L_{(t)} + R_{(t)})\} \cos \omega_c t + k\{L_{(t)} - R_{(t)}\} \cos (\omega_c t + \pi/2)] \cos \phi,$$

where, $$\phi = \tan^{-1} k\{L_{(t)} - R_{(t)}\}/[1 + k\{L_{(t)} + R_{(t)}\}]$$

where
$L_{(t)}$ and $R_{(t)}$ are the left channel signal and right channel signal, respectively;
$\omega_c$ is the angular frequency of a carrier signal; and
$k$ is a modulation factor,
comprising the steps of:
dividing the stereo signal by a signal of the form cos $\phi$; and
separately multiplying the divided stereo signal by signals having the forms cos $(\omega_c t + \pi/4)$ and cos $(\omega_c t - \pi/4)$, respectively, to produce first and second components of the stereo signal which contain the right and left channel audio signals, respectively, as full wave rectified signals.

13. A stereo signal demodulation circuit comprising:
a constant current source;
a pair of differential amplifier circuits each coupled to said source and having an input terminal means for receiving an input stereo signal and having an output terminal;
means for applying to said input means a stereo signal having the form $$e_s = [\{1 + k(L_{(t)} + R_{(t)})\} \cos \omega_c t + k\{L_{(t)} - R_{(t)}\} \cos (\omega_c t + \pi/2)] \cos \phi,$$

where, $$\phi = \tan^{-1} k\{L_{(t)} - R_{(t)}\}/[1 + k\{L_{(t)} + R_{(t)}\}]$$

where $L_{(t)}$ and $R_{(t)}$ are the left channel signal and right channel signal, respectively;
$\omega_c$ is the angular frequency of a carrier signal; and
$k$ is a modulation factor;
first and second multipliers respectively coupled to the output terminals of said differential amplifier circuits for separately multiplying the stereo signal by signals having the forms cos $(\omega_c t + \pi/4)$ and cos $(\omega_c t - \pi/4)$, respectively; and
a dividing circuit commonly coupled to said two differential amplifier circuits for dividing said stereo signal by a signal having the form of cos $\phi$, wherein, when said stereo signal is applied to said differential amplifier circuits at the same time, first and second components of said stereo signal, which represent the right and left channel audio signals, are obtained from said multipliers as full wave rectified signals.

14. The circuit of claim 8 wherein said demodulation circuit is formed as an IC module.

15. The circuit of claim 9 wherein said demodulation circuit is formed as an IC module.

* * * * *